(12) United States Patent
Ishigami et al.

(10) Patent No.: US 8,758,546 B2
(45) Date of Patent: Jun. 24, 2014

(54) BUFFER FILM FOR MULTI-CHIP PACKAGING

(75) Inventors: Akira Ishigami, Tochigi (JP); Shiyuki Kanisawa, Tochigi (JP); Hidetsugu Namiki, Tochigi (JP); Hideaki Umakoshi, Tochigi (JP); Masaharu Aoki, Tochigi (JP)

(73) Assignee: Dexerials Corporation, Tokyo (JP)

( * ) Notice: Subject to any disclaimer, the term of this patent is extended or adjusted under 35 U.S.C. 154(b) by 0 days.

(21) Appl. No.: 13/805,553

(22) PCT Filed: Sep. 12, 2011

(86) PCT No.: PCT/JP2011/070691
§ 371 (c)(1),
(2), (4) Date: Dec. 19, 2012

(87) PCT Pub. No.: WO2012/046539
PCT Pub. Date: Apr. 12, 2012

(65) Prior Publication Data
US 2013/0092310 A1    Apr. 18, 2013

(30) Foreign Application Priority Data
Oct. 7, 2010    (JP) ................... 2010-227420

(51) Int. Cl.
*H01L 21/00*    (2006.01)

(52) U.S. Cl.
USPC ........... 156/323; 438/107; 438/108; 438/118; 438/119; 438/455; 156/289

(58) Field of Classification Search
CPC .............. B21B 37/26; H01L 24/03; H01L 2224/03009; H01L 2224/11001; H01L 24/83; H01L 2224/11009; H05K 2203/0191
USPC .......... 156/323, 287, 289; 438/107, 108, 118, 438/119, 455; 29/831–853
See application file for complete search history.

(56) References Cited

U.S. PATENT DOCUMENTS 7,537,837 B2 *    5/2009    Takei et al. ................. 428/447
2009/0014498 A1 *    1/2009    Matsumura ................. 228/3.1

FOREIGN PATENT DOCUMENTS

JP         A-10-256311        9/1998
JP         A-2000-133658      5/2000
WO         WO 2010/098273 A1  9/2010

OTHER PUBLICATIONS

Dec. 13, 2011 International Search Report issued in International Patent Application No. PCT/JP2011/070691 (with translation).
Written Opinion dated Apr. 18, 2013 issued in International Application No. PCT/JP2011/070691 (Japanese language version and English language translation).

* cited by examiner

*Primary Examiner* — Katarzyna Wyrozebski Lee
*Assistant Examiner* — Carson Gross
(74) *Attorney, Agent, or Firm* — Oliff PLC (57) ABSTRACT

A buffer film for multi-chip packaging which does not cause out of alignment during multi-chip packaging and ensures favorable connection reliability has a structure in which a heat-resistant resin layer having a linear expansion coefficient of 80 ppm/° C. or less and a flexible resin layer made of a resin material having a Shore A hardness according to JIS K6253 of 10 to 80 are laminated. A multi-chip module can be produced by aligning a plurality of chip devices on a substrate through an adhesive to perform temporary adhesion, disposing the buffer film for multi-chip packaging between the chip devices and a bonding head so that the heat-resistant resin layer is on a chip device side, and connecting the plurality of chip devices with the substrate by applying heat and pressure to the chip devices toward the substrate with the bonding head.

5 Claims, 3 Drawing Sheets

BUFFER FILM FOR MULTI-CHIP PACKAGING

TECHNICAL FIELD

The present invention relates to a buffer film for multi-chip packaging and a method for producing a multi-chip module using the same.

BACKGROUND ART

Hitherto, a plurality of chip devices such as LED devices are collectively connected with a substrate through a non-conductive adhesive or an anisotropic conductive adhesive by applying heat and pressure with a bonding head. However, there are difference or variation of height of the chip devices and difference or variation of thickness of wirings or height of bumps formed on the chip device or the substrate. Therefore, the heat and pressure applied to each chip device are different. As a result, a chip device not to be heated and pressurized sufficiently or a chip device to be heated and pressurized excessively may be produced. In the former case, connection failure may occur, and in the latter case, the chip device may be damaged.

In order to eliminate the difference or variation of height of the chip devices during the connection operation by the bonding head, it has been proposed to dispose a heat-resistant rubber-like elastic body as a buffer material between the substrate and the bonding head and apply heat and pressure to the chip devices toward the substrate through the heat-resistant rubber-like elastic body.

CITATION LIST

Patent Literature

[Patent Literature 1] JP10-256311 A

SUMMARY OF THE INVENTION

Problems to be Solved by the Invention

When a rubber-like elastic body is used as a buffer layer as disclosed in Patent Literature 1, the connection strength of each chip device is favorable. However, the buffer layer may be deformed by a heating and pressurizing head so as to spread in a plane direction of the substrate. Further, the chip devices may be out of alignment due to the deformation. In some cases, there has been a problem of reduction of connection reliability.

An object of the present invention is to solve the problems of the conventional technique, and to ensure favorable connection reliability without out of alignment in multi-chip packaging.

Means for Solving the Problems

The present inventors have found that a structure in which a heat-resistant resin layer to be disposed on a chip device side, which has a linear expansion coefficient of less than a predetermined value and is unlikely to deform comparatively, and a flexible resin layer to be disposed on a bonding head side, of which a flexible resin is made of a material having a predetermined Shore A hardness and is likely to deform comparatively, are laminated is used as a buffer material to be used in multi-chip packaging, to achieve the above-described object, whereby the present invention has been completed.

The present invention provides a buffer film for multi-chip packaging having a heat-resistant resin layer and a flexible resin layer formed thereon, wherein the heat-resistant resin layer has a linear expansion coefficient of 80 ppm/° C. or lower and the flexible resin layer is made of a resin material having a Shore A hardness according to JIS K6253 of 10 to 80.

Further, the present invention provides a method for producing a multi-chip module by applying heat and pressure to a plurality of chip devices on a substrate through an adhesive with a bonding head to perform multi-chip packaging, the method including the following steps (A) to (C):

Step (A):

aligning the plurality of chip devices on the substrate through the adhesive to perform temporary adhesion;

Step (B):

disposing the above-described buffer film for multi-chip packaging between the chip devices and the bonding head so that the heat-resistant resin layer is on a chip device side; and Step (C):

connecting the plurality of chip devices with the substrate by applying heat and pressure to the chip devices toward the substrate through the buffer film for multi-chip packaging with the bonding head.

Advantageous Effects of the Invention

The buffer film for multi-chip packaging of the present invention has a structure in which a flexible resin layer to be disposed on a bonding head side, of which a flexible resin is made of a material having a predetermined Shore A hardness and is likely to deform comparatively is laminated on a heat-resistant resin to be disposed on a chip device side, which has a linear expansion coefficient of less than a predetermined value and is unlikely to deform comparatively. Therefore, when heat and pressure are applied to the buffer film with the bonding head in multi-chip packaging, the heat-resistant resin layer in contact with the chip devices is unlikely to deform. As a result, the out of alignment of the chip devices can be suppressed. On the other hand, the flexible resin layer in contact with the bonding head is likely to deform. Therefore, since the difference or variation of height of the chip devices is eliminated and heat and pressure are applied well to each of the plurality of chip devices, favorable connection reliability can be ensured.

DESCRIPTION OF EMBODIMENTS

Hereinafter, the present invention will be described in detail with reference to the drawings.

Figure 1:
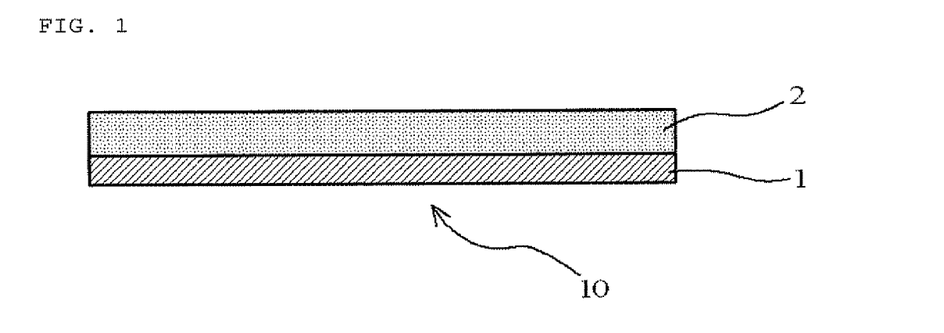
FIG. 1 is a schematic cross-sectional view of a buffer film for multi-chip packaging of the present invention.

FIG. 1 is a cross-sectional view of a buffer film 10 for multi-chip packaging having a heat-resistant resin layer 1 and a flexible resin layer 2 formed on the layer.

The heat-resistant resin layer 1 forming the buffer film 10 for multi-chip packaging of the present invention is disposed on a chip device side in the multi-chip packaging. In order to effectively suppress the out of alignment, the heat-resistant resin layer 1 has a linear expansion coefficient of 80 ppm/°C. or lower, and preferably 20 to 50 ppm/°C. in a temperature range equal to or lower than the glass transition temperature. When the linear expansion coefficient is equal to or more than the lower limit of the preferable range, the difference or variation of height of the chip devices and the like can be sufficiently eliminated. Further, when the linear expansion coefficient is equal to or lower than the upper limit of the preferable range, the out of alignment can be suppressed well.

Examples of the heat-resistant resin layer 1 may include a polyimide resin film (for example, UPILEX-25S available from Ube Industries, Ltd.), a polyester resin film (for example, Teijin Tetoron Film available from Teijin Limited), a polyvinyl chloride resin film (for example, Evilon CB300S available from Taihei Chemicals Limited), a polyolefin resin film (for example, SAN8041 available from Tech-Jam), a fluororesin film (Nitoflon (polytetrafluoroethylene) available from Nitto Denko Corporation), and the like.

When the thickness of the heat-resistant resin layer 1 is too large, the difference or variation of height of the chip devices and the like cannot be sufficiently eliminated. Therefore, it is preferably 200 μm or less, and more preferably 10 to 50 μm. Further, when the thickness is equal to or more than the lower limit of the preferable range, the out of alignment can be suppressed more effectively. When the thickness is equal to or less than the upper limit of the preferable range, the difference or variation of height of the chip devices and the like can be sufficiently eliminated.

The flexible resin layer 2 forming the buffer film 10 for multi-chip packaging of the present invention is disposed on a bonding head side in the multi-chip packaging, and is made of a resin material having a Shore A hardness according to JIS K6253 of 10 to 80, and preferably 40 to 75. When the Shore A hardness falls within this range, the difference or variation of height of the chip devices and the like can be sufficiently eliminated.

Examples of such a resin material preferably include a silicone resin material, and more preferably an anionically living-polymerizable silicone resin composition. Specific examples thereof include silicone (for example, KE-1281 and X-32-2020 available from Shin-Etsu Chemical Co., Ltd., and XE13-C1822 available from Momentive), and dimethyl silicone (for example, KER-2600 and KER-2500 available from Shin-Etsu Chemical Co., Ltd.).

When the thickness of the flexible resin layer 2 is too small, the difference or variation of height of the chip devices and the like cannot be sufficiently eliminated, and favorable connection reliability cannot be obtained. Therefore, it is preferably 10 μm or more, and more preferably 40 to 60 μm. When the thickness is equal to or more than the lower limit of the preferable range, the difference or variation of height of the chip devices and the like can be sufficiently eliminated. When the thickness is equal to or less than the upper limit of the preferable range, favorable connection reliability can be ensured.

The buffer film 10 for multi-chip packaging described above may be provided with another resin layer between the heat-resistant resin layer 1 and the flexible resin layer 2 within a range not impairing the effects of the present invention.

The buffer film 10 for multi-chip packaging of the present invention can be produced by applying a resin material for forming the flexible resin layer 2 to a film-shape heat-resistant resin layer 1 according to an ordinary method, and drying (or polymerizing) the resin material.

Further, the buffer film 10 for multi-chip packaging of the present invention can be preferably applied to a method for producing a multi-chip module by applying heat and pressure to a plurality of chip devices on a substrate through an adhesive with a bonding head to perform multi-chip packaging. The method for producing a multi-chip module includes the following steps (A) to (C).

<Step (A)>

Figure 2:
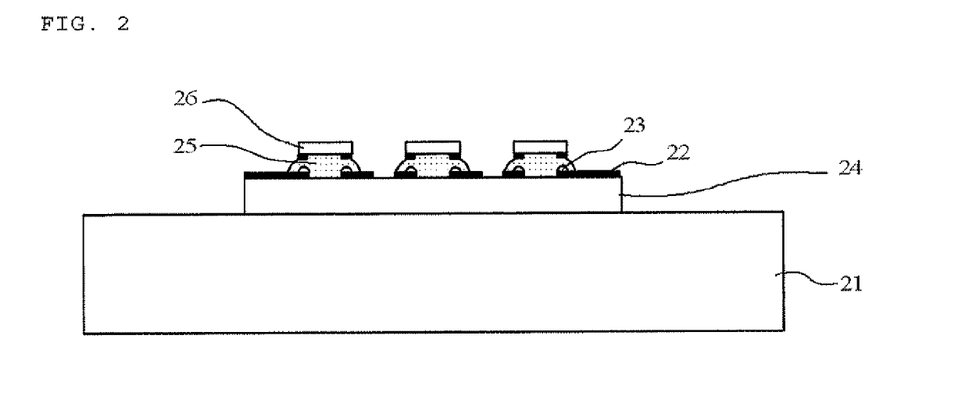
FIG. 2 is a view illustrating a method for producing a multi-chip module of the present invention.

Chip devices are aligned on a substrate through an adhesive to thereby temporarily adhere thereto. Specifically, as shown in FIG. 2, a substrate 24 having wirings 22 and bumps 23 is disposed on a known stage 21 for thermocompression bonding made of stainless steel and the like, and chip devices 26 are aligned through an adhesive 25 by a flip chip method to thereby temporarily adhere thereto. The alignment operation and the temporary adhesion operation of the chip devices 26 are not particularly limited, and can be performed by applying the alignment operation and the temporary adhesion operation performed in the conventional method for producing a multi-chip module.

Examples of the chip device 26 applicable to the production method of the present invention may include an IC device, an LED (light-emitting diode) device, and the like.

Examples of the substrate 24 having wirings 22 and bumps 23 may include a glass substrate, a plastic substrate, and a ceramic substrate, which have wirings made of various metal materials or transparent electrode materials such as ITO by a printing method, a dry plating method, a wet plating method, a photolithography method, or the like, and bumps such as a gold bump and a solder bump formed by a deposition method, a plating method, a printing method, a bonding method (stud bump), or the like.

As the adhesive 25, known non-conductive adhesive paste (NCP) or film (NCF) or anisotropic conductive paste (ACP) or film (ACF) can be used. When the chip device 26 is an LED device, from the viewpoint of productivity, it is particularly preferable that the anisotropic conductive adhesive (ACP and ACF) should be used as the adhesive 25. In particular, from the viewpoint of improvement in light extraction efficiency, it is preferable that the anisotropic conductive adhesive should exhibit light reflectivity. It is preferable that an anisotropic conductive adhesive having such light reflectivity should contain a needle-shaped light-reflective insulating particle. The details will be described after the description of the step (C) again.

<Step (B)>

Figure 3:
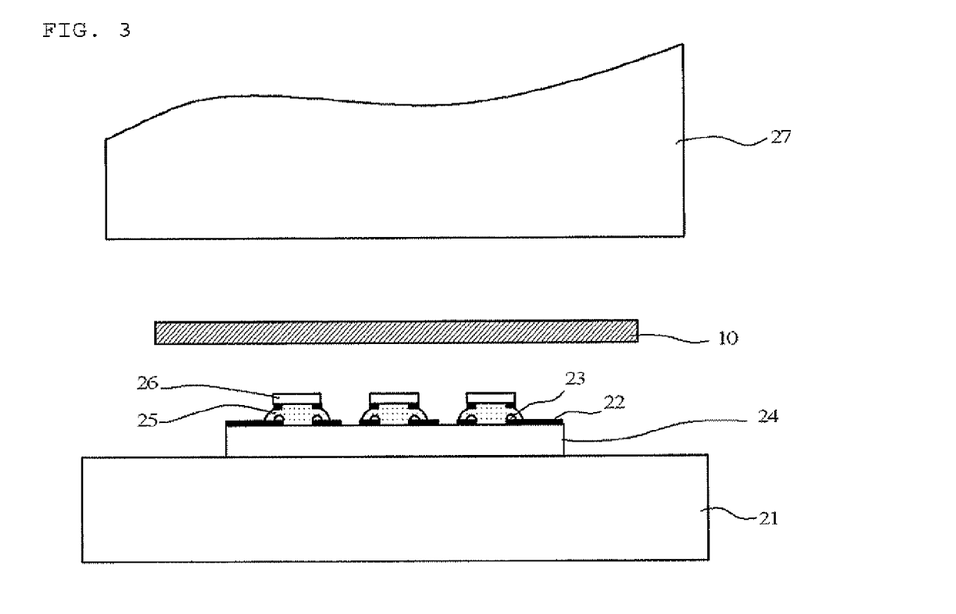
FIG. 3 is a view illustrating a method for producing a multi-chip module of the present invention using a buffer film for multi-chip packaging by single wafer processing.

As shown in FIG. 3, the buffer film 10 for multi-chip packaging of the present invention is disposed between the chip devices 26 and a bonding head 27 preferably having a metal pressure bonding face and provided with a heater. In this case, a heat-resistant resin layer 1 of the buffer film 10 for multi-chip packaging is on the side of the chip device 26.

Figure 4:
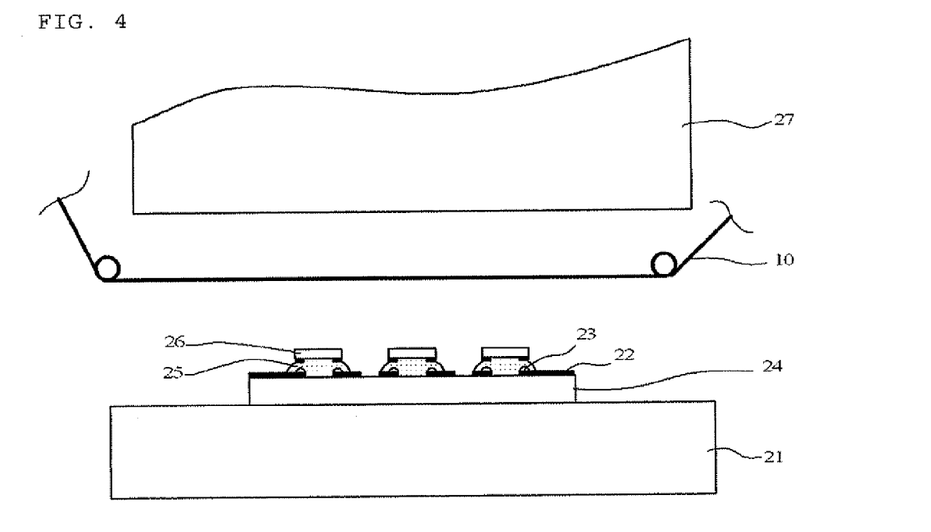
FIG. 4 is a view illustrating a method for producing a multi-chip module of the present invention using a buffer film for multi-chip packaging by roll-to-roll processing.

Herein, the buffer film 10 for multi-chip packaging may be applied for single-wafer processing as shown in FIG. 3, and is preferably applied for roll to roll processing as shown in FIG.

4. In the roll to roll processing, the buffer film 10 for multi-chip packaging can be easily exchanged, and the productivity can be improved.

<Step (C)>

Figure 5:
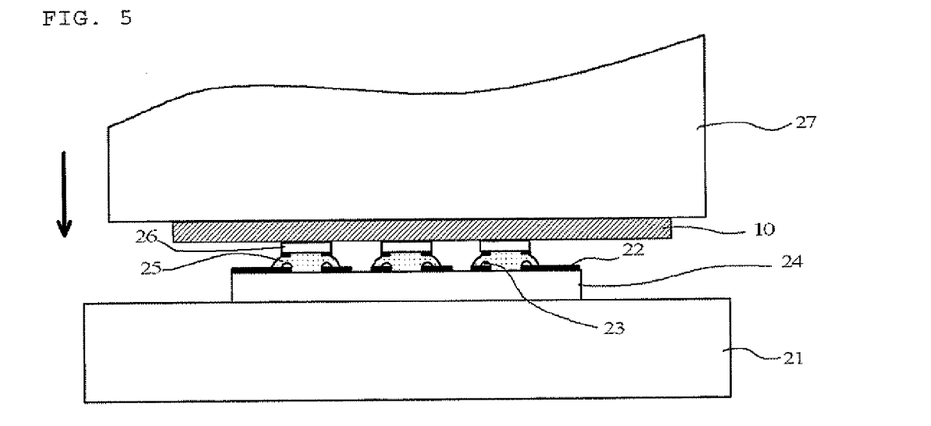
FIG. 5 is a view illustrating the method for producing a multi-chip module of the present invention.
Figure 6:
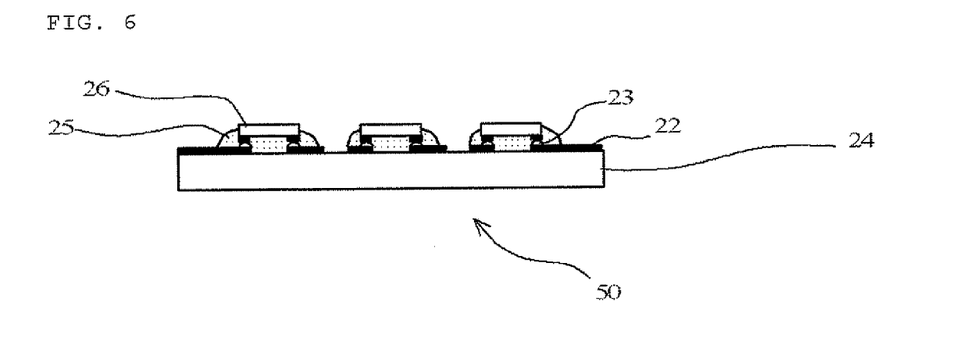
FIG. 6 is a schematic cross-sectional view of a multi-chip module obtained by the method for producing a multi-chip module of the present invention.

As shown in FIG. 5, heat and pressure are applied to the plurality of chip devices 26 toward the substrate 24 through the buffer film 10 for multi-chip packaging with the bonding head 27. After the application of heat and pressure, a multi-chip module 50 shown in FIG. 6 can be obtained.

As described above, an anisotropic conductive adhesive having light reflectivity which can be preferably used as the adhesive 25 will be described in detail.

When the chip device is an LED device, a preferably applicable adhesive is a light-reflective anisotropic conductive adhesive which contains a thermosetting resin composition, a conductive particle, and a needle-shaped light-reflective insulating particle having an aspect ratio of a predetermined range. Since the needle-shaped light-reflective particle is used, it is possible to prevent occurrence of cracks in the anisotropic conductive adhesive and obtain high connection reliability.

Note that when the thermosetting resin composition contains a spherical particle, if the stretchability of the resin composition decreases (the resin composition is cured) with temperature change, the internal stress of the thermosetting resin composition (or the cured product) is likely to cause cracks on an interface between the spherical particle and the thermosetting resin composition. The occurrence of cracks on the light-reflective anisotropic conductive adhesive leads to a loss of connection reliability. Therefore, the light-reflective anisotropic conductive adhesive needs to have excellent toughness. As described above, when the needle-shaped light-reflective insulating particle having an aspect ratio of a predetermined range is added to the thermosetting resin composition, high toughness can be imparted to the anisotropic conductive adhesive. This is because the needle-shaped light-reflective insulating particles which are each disposed in random directions in the thermosetting resin composition easily curve or easily bend. This allows the internal stress of the thermosetting resin composition with temperature change to transmit to and absorb into needle-shaped crystals. Therefore, transmission of the internal stress to the thermosetting resin composition can be suppressed. Accordingly, the light-reflective anisotropic conductive adhesive containing the needle-shaped light-reflective insulating particle exerts excellent toughness, and the occurrence of cracks or the separation of an adhesion face can be suppressed even when the thermosetting resin composition expands or contracts due to temperature change.

The needle-shaped light-reflective insulating particle is preferably made from a needle-shaped white inorganic compound. Light incident on the light-reflective anisotropic conductive adhesive reflects outward due to the insulating particle. Since the needle-shaped light-reflective insulating particle is white, the wavelength dependency of reflection property with respect to visible light can decrease and the visible light can efficiently reflect.

Since the light-reflective anisotropic conductive adhesive contains a particle which is white and is made from a needle-shaped inorganic compound having an aspect ratio of a predetermined range (hereinafter referred to as "needle-shaped white inorganic particle"), decrease of reflectance with respect to the light emitted from a light-emitting device is suppressed and the light-emitting efficiency of the light-emitting device can be maintained. In addition, cracks can be prevented and high connection reliability can be obtained.

Examples of the needle-shaped white inorganic particle may include a zinc oxide whisker, a titanate whisker such as a titanium oxide whisker, a potassium titanate whisker, and a titanic acid whisker, an aluminum borate whisker, wollastonite (needle-shaped crystal of kaolin silicate), and other needle-shaped inorganic compounds. Since a whisker is a needle-shaped crystal grown by a special production method and has an aligned crystalline structure, it has advantages of rich in elasticity and difficulty in deformation. Since the inorganic compound is white in the visible light region, the wavelength dependency of reflection property with respect to visible light is low and the visible light is likely to reflect. Among them, a zinc oxide whisker has a high degree of whiteness and no catalytic property against photodegradation even when the photodegradation of cured product of the thermosetting resin composition in a cured anisotropic conductive adhesive is concerned, and therefore it is particularly preferable.

When the needle-shaped white inorganic particle is made of a crystal having a single needle shape (single needle-shaped crystal), the fiber diameter (particle diameter in a shorter direction) is preferably 5 μm or smaller. Further, the aspect ratio of the needle-shaped white inorganic particle made of a single needle-shaped crystal is preferably more than 10 and less than 35, and particularly preferably more than 10 and less than 20. When the aspect ratio of the needle-shaped white inorganic particle is more than 10, the internal stress of the thermosetting resin composition can be sufficiently transmitted and absorbed. When the aspect ratio of the needle-shaped white inorganic particle is less than 35, a needle-shaped crystal is unlikely to be broken, and the particles can be uniformly dispersed in the thermosetting resin composition. When the aspect ratio is less than 20, dispersibility in the thermosetting resin composition can be further improved.

The needle-shaped white inorganic particles having an aspect ratio of more than 10 and less than 35 are added to the thermosetting resin composition, whereby the toughness of the thermosetting resin composition can be enhanced. Therefore, even when the light-reflective anisotropic conductive adhesive expands or contracts, the separation of an adhesion face and the occurrence of cracks can be suppressed.

As the needle-shaped white inorganic particle, a crystal (multi needle-shaped crystal) having a plurality of needle shapes such as a shape formed by connecting a center with each of apexes of a tetrahedron, like Tetrapod (registered trademark), may be used instead of the single needle-shaped crystal. A needle-shaped white inorganic particle of a multi needle-shaped crystal is excellent in larger thermal conductivity, but has a bulkier crystalline structure as compared with the needle-shaped white inorganic particle of single needle-shaped crystal. Therefore, during thermocompression bonding, an attention needs to be paid not to cause the needle-shaped part to damage connecting parts of the substrate and the devices.

The needle-shaped white inorganic particle may be one treated with a silane-coupling agent. The treatment of the needle-shaped white inorganic particle with a silane-coupling agent can improve dispersibility in the thermosetting resin composition. For this reason, the needle-shaped white inorganic particle treated with a silane-coupling agent can be uniformly mixed in the thermosetting resin composition in a short period of time.

The refractive index (JIS K7142) of the needle-shaped white inorganic particle is preferably larger than that of the cured product of the thermosetting resin composition, and more preferably larger by at least about 0.02. This is because a small difference of the refractive index decreases the reflection efficiency on the interface. Therefore, an inorganic particle having a refractive index equal to or less than that of the used thermosetting resin composition and even having light reflectivity and insulation property, like $SiO_2$, cannot be applied as the needle-shaped white inorganic particle.

When the mixed amount of the needle-shaped white inorganic particle in the light-reflective anisotropic conductive adhesive is too small, sufficient light reflection tends not to be obtained. On the other hand, when it is too large, the adhesive property of the thermosetting resin composition tends to reduce. The mixed amount is preferably 1 to 50% by volume based on the thermosetting resin composition, and particularly preferably 5 to 25% by volume.

Since the light-reflective anisotropic conductive adhesive applicable to the production method of the present invention covers most of the conductive particle by containing the needle-shaped white inorganic particle, even when the conductive particle is colored such as brown, whiteness of the thermosetting resin composition is attained. Due to the whiteness, the wavelength dependency of reflection property with respect to visible light can decrease and the visible light is likely to reflect. Therefore, regardless of kind of color of a substrate electrode, decrease of reflectance of light emitted from an LED device can be suppressed, and other light emitted from the LED device toward the underside can be efficiently used. Accordingly, the light-emitting efficiency (light extraction efficiency) of the LED device can be improved.

To the light-reflective anisotropic conductive adhesive described above, a particle made of a spherical white inorganic compound (hereinafter referred to as "spherical white inorganic particle") may be added as a spherical white insulating particle in addition to the needle-shaped white inorganic particle. The addition of the spherical white inorganic particle with the needle-shaped white inorganic particle further whitens the thermosetting resin composition, and the light extraction efficiency of the LED device can be improved. Also in this case, the toughness of the thermosetting resin composition can be enhanced. It is preferable that the added amount (% by volume) of the needle-shaped white inorganic particle be equal to or more than that of the spherical white inorganic particle.

When the spherical white inorganic particles are added to the light-reflective anisotropic conductive adhesive together with the needle-shaped white inorganic particles, the light-reflective anisotropic conductive adhesive can exhibit excellent toughness. Therefore, even during expansion and contraction, the separation of an adhesion face or the occurrence of cracks can be suppressed.

As the conductive particle contained in the light-reflective anisotropic conductive adhesive as described above, a particle of a metal material used in the conventional conductive particle for anisotropic conductive connection can be used. Examples of the metal material for the conductive particle may include gold, nickel, copper, silver, solder, palladium, aluminum, an alloy thereof, a multi-layered material thereof (for example, nickel plating/gold flash plating material), and the like.

Since the conductive particle using gold, nickel, or copper as the metal material is brown, the particle can obtain effects of the present invention as compared with the other metal materials. As described above, since needle-shaped white inorganic particles cover most conductive particles in the thermosetting resin composition, the thermosetting resin composition is prevented from turning brown due to the conductive particles, and the whole thermosetting resin composition has high whiteness.

Further, as the conductive particle, a metal-coated resin particle in which a resin particle is coated with a metal material may be used. Examples of such a resin particle may include a styrene-based resin particle, a benzoguanamine resin particle, a nylon resin particle, and the like. As a method for coating a resin particle with a metal material, a conventionally known method can be used, and for example, an electroless plating method, an electrolytic plating method, and the like can be used. The thickness of layer of a metal material for coating may take any thickness enough to ensure favorable connection reliability, and may depend on a particle diameter of the resin particle or a kind of metal. It is usually 0.1 to 3 μm.

When the particle diameter of the resin particle is too small, the connection failure may occur, and when it is too large, patterns are likely to be short-circuited. Therefore, it is preferably 1 to 20 μm, more preferably 3 to 10 μm, and particularly preferably 3 to 5 μm. In this case, it is preferable that the shape of the resin particle should be spherical. Further, the shape may be flaky or a rugby ball shape.

The metal-coated resin particle is spherical, and a too large particle diameter thereof tends to reduce connection reliability, and therefore the particle diameter is preferably 1 to 20 μm, and more preferably 3 to 10 μm.

Figure 7A:
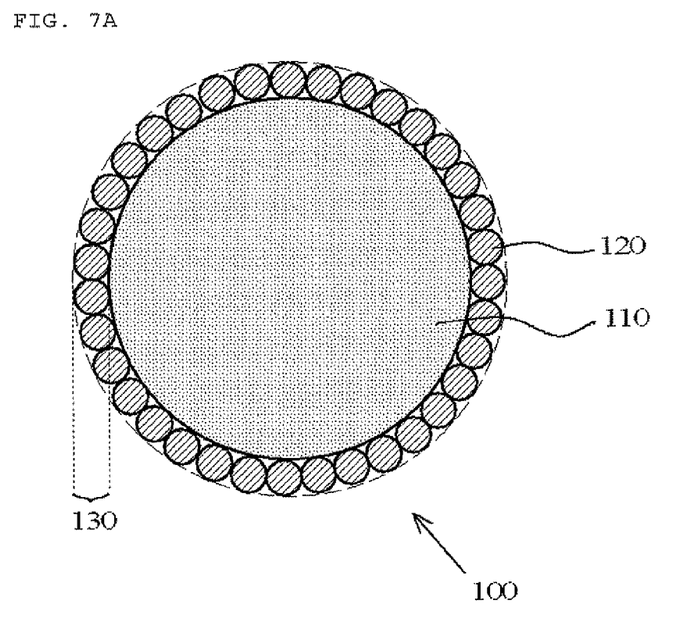
FIG. 7A is a schematic cross-sectional view of a light-reflective conductive particle used for a light-reflective anisotropic conductive adhesive.
Figure 7B:
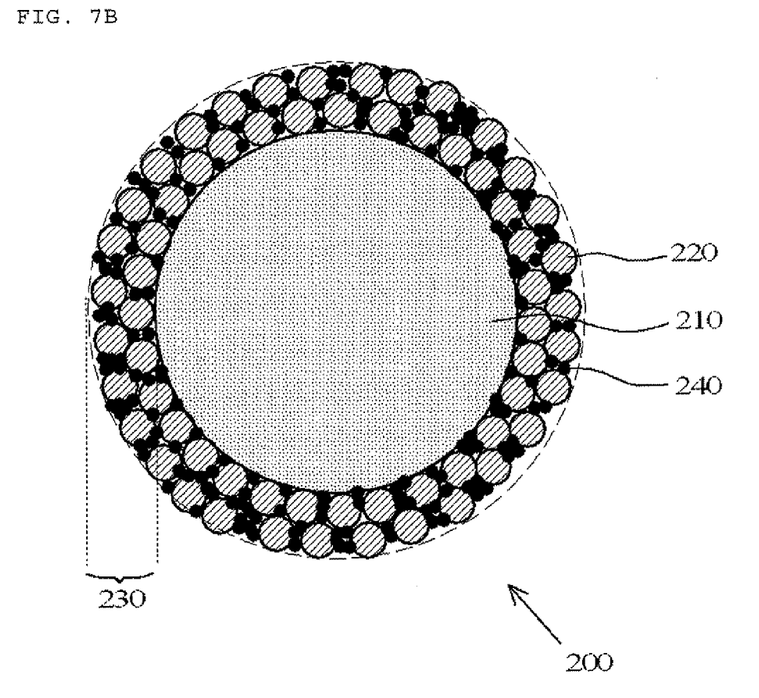
FIG. 7B is a schematic cross-sectional view of a light-reflective conductive particle used for a light-reflective anisotropic conductive adhesive.

The conductive particle contained in the light-reflective anisotropic conductive adhesive described above may be a light-reflective conductive particle to which light reflectivity is imparted as shown in the cross-sectional views of FIGS. 7A and 7B.

A light-reflective conductive particle 100 shown in FIG. 7A includes a core particle 110 coated with a metal material, and a light-reflective layer 130 formed on the surface of the particle and made from at least one kind of inorganic particle 120 selected from a titanium oxide ($TiO_2$) particle, a zinc oxide (ZnO) particle, and an aluminum oxide ($Al_2O_3$) particle. The light-reflective layer 130 made from such an inorganic particle 120 has color ranging from white to gray. Accordingly, the wavelength dependency of reflection property with respect to visible light is low and the visible light is likely to reflect, and therefore the light-emitting efficiency of the LED device can be further improved.

When photodegeneration of the cured product of the thermosetting resin composition of the cured light-reflective anisotropic conductive adhesive is concerned, among a titanium oxide particle, a zinc oxide particle, and an aluminum oxide particle, the zinc oxide which has no catalytic property with respective to the photodegeneration and high refractive index can be preferably used as described above.

Since the core particle 110 is subjected to anisotropic conductive connection, the surface of the core particle is made from a metal material. As an aspect of the core particle 110, an aspect in which the core particle 110 itself is a metal material, or an aspect in which the surface of a resin particle is coated with a metal material may be exemplified.

From the viewpoint of size relative to the particle diameter of the core particle 110, when the thickness of the light-reflective layer 130 made from the inorganic particle 120 is too small as compared with the particle diameter of the core particle 110, the reflectance significantly decreases, and when it is too large, connection failure may occur. Therefore, the thickness of the light-reflective layer 130 is preferably 0.5 to 50%, and more preferably 1 to 25%.

In the light-reflective conductive particle 100, when the particle diameter of the inorganic particle 120 forming the light-reflective layer 130 is too small, light-reflection phenomenon is unlikely to occur, and when it is too large, the formation of the light-reflective layer tends to become difficult. Therefore, the particle diameter of the inorganic particle 120 is preferably 0.02 to 4 µm, more preferably 0.1 to 1 µm, and particularly preferably 0.2 to 0.5 µm. From the viewpoint of wavelength of light to be reflected, it is preferable that the particle diameter of the inorganic particle 120 should be equal to or more than 50% of wavelength of light to be reflected (that is, light emitted from the light-emitting device) so that the light does not pass therethrough. In this case, examples of shape of the inorganic particle 120 may include an amorphous shape, a spherical shape, a flaky shape, a needle shape, and the like. Among them, the spherical shape is preferable in terms of light diffusion effect, and the flaky shape is preferable in terms of total reflection effect.

The light-reflective conductive particle 100 can be produced by a known film formation technique (so-called mechano-fusion method) in which powders of various sizes are caused to physically collide with each other to form a film made from particles having a smaller particle diameter on the surface of particles having a larger particle diameter. In this case, the inorganic particles 120 are fixed to the metal material on the surface of the core particle 110 to bite into the metal material. Further, the inorganic particles are unlikely to be fixed to each other by fusion, and therefore a monolayer of the inorganic particle constitutes the light-reflective layer 130. In FIG. 7A, the thickness of the light-reflective layer 130 may be equal to or slightly less than the particle diameter of the inorganic particle 120.

A light-reflective conductive particle 200 shown in FIG. 7B is different from the light-reflective conductive particle 100 of FIG. 7A in terms of facts in which the light-reflective layer 230 contains a thermoplastic resin 240 functioning as an adhesive, in which the inorganic particles 220 are fixed to each other by the thermoplastic resin 240, and in which the light-reflective inorganic particles 220 each include multi layers (for example, two layers or three layers). The presence of the thermoplastic resin 240 improves mechanical strength of the light-reflective layer 230, and therefore the separation of the inorganic particles is unlikely to occur.

As the thermoplastic resin 240, a halogen-free thermoplastic resin can be preferably used for reduction of the load on the environment. For example, polyolefin such as polyethylene and polypropylene, polystyrene, acrylic resin, and the like, can be preferably used.

Such a light-reflective conductive particle 200 can be also produced by the mechano-fusion method. When the particle diameter of a thermoplastic resin 240 to be applied to the mechano-fusion method is too small, adhesion function deteriorates, and when it is too large, the thermoplastic resin 240 is unlikely to adhere to the core particle 210. Therefore, it is preferably 0.02 to 4 µm, and more preferably 0.1 to 1 µm. Further, when the mixed amount of the thermoplastic resin 240 is too small, the adhesion function deteriorates, and when it is too large, agglomerates of the particles are formed. Therefore, the mixed amount is preferably 0.2 to 500 parts by mass based on 100 parts by mass of the inorganic particle 220, and more preferably 4 to 25 parts by mass.

As the thermosetting resin composition contained in the light-reflective anisotropic conductive adhesive, a colorless and transparent material is preferably used. This is because the light reflective efficiency of the light-reflective conductive particle in the light-reflective anisotropic conductive adhesive is not caused to decrease, and the incident light reflects without the color change of the incident light. The colorless and transparent herein means that the cured product of the light-reflective anisotropic conductive adhesive has a light transmmisivity (JIS K7105) of 80% or more with a light path length of 1 cm with respect to visible light having a wavelength of 380 to 780 nm, and preferably 90% or more.

In the light-reflective anisotropic conductive adhesive, when the mixed amount of the conductive particle such as a light-reflective conductive particle based on 100 parts by mass of the thermosetting resin composition is too small, connection failure may occur, and when it is too large, patterns tend to be short-circuited. Therefore, it is preferably 1 to 100 parts by mass, and more preferably 10 to 50 parts by mass.

The addition of the needle-shaped white inorganic particles to the thermosetting resin composition can allow the light-reflective anisotropic conductive adhesive to have a reflectance (JIS K7105) to light having a wavelength of 450 nm of more than 9%. The other factors such as reflection property and mixed amount of the light-reflective conductive particle and mixed composition of the thermosetting resin composition can be appropriately adjusted to exert a reflectance (JIS K7105) to light having a wavelength of 450 nm of 30% or more as the reflection property of the light-reflective anisotropic conductive adhesive. In general, increase of the mixed amount of the light-reflective conductive particle having a favorable reflection property tends to increase the reflectance.

From the viewpoint of refractive index, the reflection property of the light-reflective anisotropic conductive adhesive can be evaluated. This is because when the reflectance of the cured product is larger than the refractive index of the cured product of the thermosetting resin composition except for the conductive particles and the light-reflective insulating particles, the light reflection amount on the interface between the light-reflective insulating particles and the cured product of the thermosetting resin composition surrounding the particle increases. Specifically, it is desirable that a difference obtained by subtracting the refractive index (JIS K7142) of the cured product of the thermosetting resin composition from that of the light-reflective insulating particle should be preferably 0.02 or more, and more preferably 0.2 or more. The refractive index of the thermosetting resin composition containing an epoxy resin as a main component is usually about 1.5.

As the thermosetting resin composition, compounds used in the conventional anisotropic conductive adhesive can be used. In general, the thermosetting resin composition is obtained by mixing a curing agent in an insulating binder resin. Preferable examples of the insulating binder resin may include epoxy resins containing an alicyclic epoxy compound, a heterocyclic epoxy compound, or a hydrogenated epoxy compound as a main component.

Preferred examples of the alicyclic epoxy compound may include compounds having two or more epoxy groups in their molecules. These may be liquid or solid. Specific examples may include glycidyl hexahydrobisphenol, epoxycyclohexenylmethyl-epoxycyclohexene carboxylate, and the like. Among these, it is preferable that glycidyl hexahydrobisphenol A and 3,4-epoxycyclohexenylmethyl-3',4'-epoxycyclohexene carboxylate be used in terms of the fact in which the cured product can ensure the light transmmisivity suitable to packaging of an LED element and rapid curing properties are excellent.

Examples of the heterocyclic epoxy compound may include epoxy compounds having a triazine ring. In particular, 1,3,5-tris(2,3-epoxypropyl)-1,3,5-triazine-2,4,6-(1H,3H, 5H)-trione is preferable.

As the hydrogenated epoxy compound, hydrogenated compounds of the alicyclic epoxy compound and the heterocyclic epoxy compound as described above, and other known hydrogenated epoxy resins can be used.

The alicyclic epoxy compound, the heterocyclic epoxy compound, and the hydrogenated epoxy compound may be used alone, or two or more kinds thereof may be used in combination. Another epoxy compound may be used in combination with these epoxy compounds as long as the effects of the present invention are not adversely affected. Examples thereof may include glycidyl ethers obtained by reacting epichlorohydrin with a polyhydric phenol such as bisphenol A, bisphenol F, bisphenol S, tetramethylbisphenol A, diarylbisphenol A, hydroquinone, catechol, resorcin, cresol, tetrabromobisphenol A, trihydroxybiphenyl, benzophenone, bisresorcinol, bisphenol hexafluoroacetone, tetramethylbisphenol A, tetramethylbisphenol F, tris(hydroxyphenyl)methane, bixylenol, phenol-novolac, and cresol novolac; polyglycidyl ethers obtained by reacting epichlorohydrin with an aliphatic polyhydric alcohol such as glycerol, neopentyl glycol, ethylene glycol, propylene glycol, hexylene glycol, polyethylene glycol, and polypropylene glycol; glycidyl ether esters obtained by reacting epichlorohydrin with a hydroxycarboxylic acid such as p-oxybenzoic acid and β-oxynaphthoic acid; polyglycidyl esters obtained from polycarboxylic acids such as phthalic acid, methylphthalic acid, isophthalic acid, terephthalic acid, tetrahydrophthalic acid, endomethylene tetrahydrophthalic acid, endomethylene hexahydrophthalic acid, and trimellitic acid; glycidylaminoglycidyl ethers obtained from aminophenol and aminoalkylphenol; glycidylaminoglycidyl esters obtained from aminobenzoic acid; glycidylamines obtained from aniline, toluidine, tribromoaniline, xylylenediamine, diamino cyclohexane, bisaminomethylcyclohexane, 4,4'-diaminodiphenylmethane, and 4,4'-diaminodiphenylsulfone; and known epoxy resins such as epoxydized polyolefins.

As the curing agent, an anhydride, an imidazole compound, dicyan, and the like can be used. Among them, an acid anhydride which is difficult to change the color of the cured product, and particularly an alicyclic acid anhydride curing agent can be preferably used. Specific examples thereof may preferably include methylhexahydrophthalic anhydride and the like.

In the case where an alicyclic epoxy compound and an alicyclic acid anhydride curing agent are used in the thermosetting resin composition, if the used amount of the alicyclic acid anhydride curing agent is too small, the amount of an uncured epoxy compound may increase. If the used amount is too large, corrosion of a material to be adhered tends to be promoted by effects of excess curing agent. Therefore, it is preferable that the alicyclic anhydride curing agent be used in a ratio of 80 to 120 parts by mass based on 100 parts by mass of the alicyclic epoxy compound, and more preferably 95 to 105 parts by mass.

The light-reflective anisotropic conductive adhesive can be produced by uniformly mixing the thermosetting resin composition, the conductive particles, and the needle-shaped white inorganic particles as the light-reflective insulating particles. When a light-reflective anisotropic conductive film is produced, the thermosetting resin composition, the conductive particles, the needle-shaped white inorganic particles as the light-reflective insulating particles are dispersed and mixed in a solvent such as toluene, and the resultant mixture is applied to a PET film having been subjected to peeling treatment so as to have a desired thickness, and dried at about 80° C.

EXAMPLES

The present invention will now be described in more detail using the following Examples.

Examples 1 to 6 and Comparative Examples 1 to 4

(Production of buffer film for multi-chip packaging) A silicone-based resin composition shown in Table 1 was applied to a heat-resistant resin film (heat-resistant resin layers) shown in Table 1 by the screen printing method and dried at 120° C. for one hour to form a flexible resin layer, thereby producing a buffer film for multi-chip packaging.

As the heat-resistant resin films and the silicone-based resin compositions, the following materials were used.
Polyimide resin film: UPILEX-25S, Ube Industries, Ltd.
Polyester resin film: Teijin Tetoron Film, Teijin Limited
Polyvinyl chloride resin film: Evilon CB3005, Taihei Chemicals Limited
Polyolefin resin film: SAN8041, Tech-Jam
Fluororesin film (polytetrafluoroethylene): Nitoflon, Nitto Denko Corporation
Silicone: KE-1281, X-32-2020, Shin-Etsu Chemical Co., Ltd.
Silicone: XE13-1822, MOMENTIVE
Dimethyl silicone: KER-2600, Shin-Etsu Chemical Co., Ltd.
Dimethyl silicone: KER-2500, Shin-Etsu Chemical Co., Ltd.

A plurality of LED devices were collectively mounted on a circuit substrate by the flip chip method using the produced buffer films for multi-chip packaging and a light-reflective anisotropic conductive adhesive described below to obtain multi-chip modules. As for the multi-chip modules, "connection reliability" and "out of alignment" were evaluated on a test. The obtained evaluation results are shown in Table 1.

<Preparation of Light-Reflective Anisotropic Conductive Adhesives>

Needle-shaped white inorganic particles and conductive particles (particle diameter: 5 μm) in which the surface of spherical particle was plated with gold were mixed in a thermosetting resin composition made from an epoxy curing adhesive (adhesive binder containing CEL2021P-MeHHPA as a main component) to prepare a light-reflective anisotropic conductive adhesive. The added amount of the needle-shaped white inorganic particle was 12.0% by volume based on the thermosetting resin composition. As the needle-shaped white inorganic particle, a titanium dioxide ($TiO_2$) whisker having a particle diameter of 1.7 μm in the longer side direction and of 0.13 μm in the shorter side direction (aspect ratio: 13.1) was used. The added amount of the conductive particle was 10% by mass based on the thermosetting resin composition.

<Production of Multi-Chip Module>

An Au bump having a height of 10 μm was formed using a bump holder (FB700, Kaijo Corporation) on a glass epoxy substrate having wirings in which copper wirings having a pitch of 100 μm had been Ni/Au plated (5.0 μm/0.3 μm in thickness) and capable of mounting 20 LED devices. The anisotropic conductive adhesive was applied to the glass epoxy substrate having an Au bump so as to have a thickness of 15 μm, and 20 LED chip devices having a square of side 0.3 mm were mounted on the substrate, and temporarily adhered. The buffer films for multi-chip packaging of Examples and Comparative Examples were disposed between the temporarily adhered LED chip devices and the heating and pressurizing head using a flip chip bonder provided with a metallic heating and pressurizing head, and subjected to application of heat and pressure at 200° C. for 30 seconds to obtain multi-chip modules.

<Connection Reliability Evaluation>

The connection resistance of each of the multi-chip modules immediately after the production was measured using a curve tracer (TCT-2004, Kokuyo Electric Co., Ltd.). The obtained results are shown in Table 1. The multi-chip modules were then subjected to a temperature cycle test (TCT: exposure to an atmosphere of −40° C. and 100° C. for 30 minutes is defined as one temperature cycle. 500 or 1000 cycles were performed.), and the connection resistance was measured. The obtained results are shown in Table 1.

A Vf value during If=20 mA was measured, and connection reliability was evaluated in accordance with the following criteria. When short circuit (leakage) was confirmed due to chip damage and the like during mounting, the connection reliability was represented as "*", and when the connection was opened (impossible), it was represented as "-."

Rank Criterion

AA: The increment of Vf value from the initial Vf value is less than ±0.05 V.

A: The increment of Vf value from the initial Vf value is ±0.05 V or more and less than ±0.07 V.

B: The increment of Vf value from the initial Vf value is ±0.07 V or more and less than ±0.1 V.

C: The increment of Vf value from the initial Vf value is ±0.1 V or more.

<Evaluation of Out of Alignment>

The external appearance of each of the obtained multi-chip modules was observed with a microscopy, and the observed gaps between the LED chip devices and the bumps on the substrate were evaluated in accordance with the following criteria.

Rank Criterion

AA: No gap was observed between the electrodes of the LED devices and the bumps on the substrate.

A: Some gaps were observed between the electrodes of the LED devices and the bumps on the substrate, but there was no problem in practical use.

B: Some gaps were observed between the electrodes of the LED devices and the bumps on the substrate, but electric connection was ensured.

C: Remarkable gaps were observed between the electrodes of the LED devices and the bumps on the substrate, and electric connection was not obtained.

As shown in Table 1, in the multi-chip modules produced using the buffer films for multi-chip packaging of Examples 1 to 6, out of alignment in the LED chip was observed, and connection reliability at the early stage and after 1000 TCT cycles was favorable. In particular, the result of Example 1 is better than those of other Examples.

On the other hand, in the multi-chip module produced using the buffer film for multi-chip packaging of Comparative Example 1, out of alignment in the LED chip was not observed, but leakage was observed at the initial evaluation of the connection reliability test due to no flexible resin layer and favorable connection reliability was not obtained.

In the multi-chip module produced using the buffer film for multi-chip packaging of Comparative Example 2, out of alignment in the LED chip was not observed, but there was a problem of connection reliability because the flexible resin layer was relatively hard.

In the multi-chip module produced using the buffer film for multi-chip packaging of Comparative Example 3, the heat-resistant resin layer of the buffer film was thermally contracted, and out of alignment in the LED chip was observed. Further, the initial connection reliability was favorable, but the Vf value after 500 TCT cycles remarkably increased, and connection after 1000 TCT cycles was opened.

In the multi-chip module produced using the buffer film for multi-chip packaging of Comparative Example 4, the buffer film was deformed, and the LED chips were completely out of alignment.

Industrial Applicability

The buffer film for multi-chip packaging of the present invention has a structure in which a flexible resin to be disposed on a bonding head side, which is made from a material having a predetermined Shore A hardness and is likely to deform comparatively is laminated on a heat-resistant resin layer to be disposed on a chip device side, which has a linear expansion coefficient of less than a predetermined value and is unlikely to deform comparatively. Therefore, when heat and pressure are applied to the buffer film with a bonding head in multi-chip packaging, the heat-resistant resin layer in contact with the chip devices is unlikely to deform. As a result, the out of alignment of the chip devices can be suppressed. On the other hand, since the flexible resin layer in contact with the bonding head is likely to deform, the difference or variation of height of the chip devices is eliminated. In this state, heat and

TABLE 1

| | | Linear Expansion Coefficient [ppm/° C.] | Shore A Hardness | Example (Thickness μm) | | | | | | Comparative Example (Thickness μm) | | | |
|---|---|---|---|---|---|---|---|---|---|---|---|---|---|
| | | | | 1 | 2 | 3 | 4 | 5 | 6 | 1 | 2 | 3 | 4 |
| Heat-Resistant Resin Layer in Buffer Film | Upilex-25S | 12 | | 12.5 | | 12.5 | | 12.5 | 12.5 | 12.5 | 12.5 | | |
| | Teijin Tetoron | 60 | | | 16 | | | | | | | | |
| | Evilon CB3005 | 70 | | | | | 15 | | | | | | |
| | SAN8041 | 110 | | | | | | | | | | 50 | |
| | Nitoflon | 100 | | | | | | | | | | | 50 |
| Flexible Resin Layer in Buffer Film | KE-1281 | | 20 | | | 50 | | | 15 | None | | | None |
| | KER-2600 | | 47 | | | | 50 | | | | — | | |
| | KER-2500 | | 70 | 50 | 50 | | | | | | | 50 | |
| | X-32-2020 | | 78 | | | | | 50 | | | | | |
| | XE13-C1822 | | 94 | | | | | | | | 50 | | |
| Out of Alignment | | | | AA | A | A | A | A | A | A | A | C | C |
| Connection Reliability | Early Stage | | | AA | A | A | A | A | A | * | — | A | — |
| | After 500 TCT Cycles | | | AA | A | A | A | A | A | | | B | |
| | After 100 TCT Cycles | | | AA | A | A | A | A | A | | | — | | pressure are applied well to each of the chip devices, so that favorable connection reliability can be ensured. Accordingly, this is useful for multi-chip packaging in which a plurality of chip devices are collectively mounted on a substrate.

REFERENCE SIGNS LIST

1 heat-resistant resin layer
2 flexible resin layer
10 buffer film for multi-chip packaging
21 stage
22 wiring
23 bump
24 substrate
25 adhesive
26 chip device
27 bonding head
50 multi-chip module
100, 200 light-reflective conductive particle
110, 210 core particle
120, 220 inorganic particle
130, 230 light-reflective layer
240 thermoplastic resin

The invention claimed is:

1. A method for producing a multi-chip module by applying heat and pressure to a plurality of chip devices on a substrate through an adhesive with a bonding head to perform multi-chip packaging, the method comprising the steps (A) to (C):

Step (A):
aligning the plurality of chip devices on the substrate through the adhesive to perform temporary adhesion;

Step (B):
disposing a buffer film between the chip devices and the bonding head, the buffer film comprising a heat-resistant resin layer and a flexible layer formed thereon, wherein the heat-resistant resin layer has a linear expansion coefficient of 80 ppm/° C. or lower and the flexible resin layer is made of a resin material having a Shore A hardness according to JIS-K6253 of 10 to 80, so that the heat-resistant resin layer is on a chip device side; and Step (C):
connecting the plurality of chip devices with the substrate by applying heat and pressure to the chip devices toward the substrate through the buffer film for multi-chip packaging with the bonding head.

2. The method for producing a multi-chip module according to claim 1, wherein the chip devices are LED devices.

3. The method for producing a multi-chip module according to claim 1, wherein the buffer film for multi-chip packaging is applied by single wafer processing.

4. The method for producing a multi-chip module according to claim 1, wherein the buffer film for multi-chip packaging is applied by roll-to-roll processing.

5. The method for producing a multi-chip module according to claim 2, wherein the adhesive is an anisotropic conductive adhesive containing a needle-shaped light-reflective insulating particle.

* * * * *